(12) United States Patent
Shelnutt et al.

(10) Patent No.: US 9,936,614 B2
(45) Date of Patent: Apr. 3, 2018

(54) SYSTEM AND METHOD FOR AUTOMATED OPEN LOOP FAN CONTROL

(71) Applicant: Dell Products, LP, Round Rock, TX (US)

(72) Inventors: Austin M. Shelnutt, Leander, TX (US); Travis C. North, Cedar Park, TX (US); Christopher M. Helberg, Austin, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 471 days.

(21) Appl. No.: 14/619,698

(22) Filed: Feb. 11, 2015

(65) Prior Publication Data

US 2016/0234971 A1 Aug. 11, 2016

(51) Int. Cl.
*G06F 1/20* (2006.01)
*H05K 7/20* (2006.01)

(52) U.S. Cl.
CPC ..... *H05K 7/20836* (2013.01); *H05K 7/20727* (2013.01)

(58) Field of Classification Search
CPC .. H05K 7/20836; H05K 7/20727; H05K 7/20; H05K 7/20136; H05K 7/20209; G06F 1/203; G06F 1/20; G05B 2219/49216
See application file for complete search history.

(56) References Cited

U.S. PATENT DOCUMENTS

| | | | | |
|---|---|---|---|---|
| 7,319,299 | B2 | 1/2008 | Freeman et al. | |
| 8,179,071 | B2 * | 5/2012 | Phelan | G06F 1/206 318/460 |
| 8,212,501 | B2 | 7/2012 | Artman et al. | |
| 8,767,399 | B2 | 7/2014 | Goto et al. | |
| 8,914,155 | B1 * | 12/2014 | Shah | H05K 7/20836 700/19 |
| 8,963,465 | B2 * | 2/2015 | Chiu | F04D 27/004 165/246 |
| 2002/0167797 | A1 * | 11/2002 | Willers | G06F 1/20 361/695 |
| 2003/0234630 | A1 * | 12/2003 | Blake | F04D 27/004 318/471 |
| 2007/0156361 | A1 * | 7/2007 | Hardt | F04D 27/004 702/99 |
| 2007/0182608 | A1 * | 8/2007 | Testin | H05K 7/20209 341/139 |
| 2007/0285042 | A1 * | 12/2007 | Frankel | H05K 7/20209 318/599 |

(Continued)

*Primary Examiner* — Ronald Hartman, Jr.
(74) *Attorney, Agent, or Firm* — Larson Newman, LLP

(57) ABSTRACT

An information handling system includes a pressure transducer and a fan controller. The pressure transducer produces a pressure reading in response to airflow through the information handling system. The fan controller is configured to communicate with the pressure transducer, the fan controller to operate a fan of an information handling system at a first duty cycle, to receive a first pressure reading from the pressure transducer, to determine a first airflow amount for the first duty cycle based on the first pressure reading, to create a first updated airflow-duty cycle table based on the first airflow amount at the first duty cycle, and to update a temperature control algorithm based on the first updated airflow-duty cycle table.

17 Claims, 4 Drawing Sheets

(56) References Cited

U.S. PATENT DOCUMENTS

| | | | |
|---|---|---|---|
| 2008/0104985 A1* | 5/2008 | Carlsen | F24F 11/0009 62/228.4 |
| 2009/0088873 A1* | 4/2009 | Avery | G06F 1/206 700/51 |
| 2010/0286843 A1* | 11/2010 | Lyon | G05D 23/1932 700/300 |
| 2011/0103008 A1* | 5/2011 | Aklilu | G06F 1/20 361/679.48 |
| 2011/0195652 A1* | 8/2011 | Smith | F24F 11/008 454/184 |
| 2011/0228471 A1* | 9/2011 | Humphrey | F04D 27/004 361/679.48 |
| 2012/0078422 A1* | 3/2012 | Mejias | H05K 7/20836 700/277 |
| 2012/0100794 A1* | 4/2012 | Redshaw | G06F 1/206 454/184 |
| 2012/0215359 A1* | 8/2012 | Michael | G06F 1/206 700/275 |
| 2012/0218707 A1* | 8/2012 | Chan | H05K 7/20518 361/679.48 |
| 2013/0131886 A1* | 5/2013 | Nitta | H05K 7/20209 700/300 |
| 2013/0213082 A1* | 8/2013 | Woodbury, II | B62B 5/0026 62/498 |
| 2013/0258582 A1* | 10/2013 | Shelnutt | G06F 1/206 361/679.48 |
| 2014/0011437 A1* | 1/2014 | Gosselin | H05K 7/20209 454/154 |
| 2014/0031956 A1* | 1/2014 | Slessman | G05B 13/02 700/28 |
| 2014/0206272 A1* | 7/2014 | Kodama | H05K 7/20836 454/184 |
| 2014/0244051 A1* | 8/2014 | Rollins | G05D 27/02 700/282 |
| 2015/0003010 A1* | 1/2015 | Kinstle, III | H05K 7/20836 361/679.49 |
| 2015/0208553 A1* | 7/2015 | Bauchot | H05K 7/20745 361/679.47 |
| 2015/0305197 A1* | 10/2015 | King | H05K 7/207 361/695 |
| 2016/0265544 A1* | 9/2016 | Chen | F04D 27/004 |
| 2017/0059263 A1* | 3/2017 | Sun | H05K 7/20181 |

* cited by examiner

SYSTEM AND METHOD FOR AUTOMATED OPEN LOOP FAN CONTROL

FIELD OF THE DISCLOSURE

The present disclosure generally relates to system and method for automated open loop fan control.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

An information handling system, such as a server, can include fan control algorithms to control fans that cool components within the server. As the number of components located within a server change the amount of airflow that a fan is capable of moving through the server at a same fan speed or duty cycle can also change.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

Figure 1:
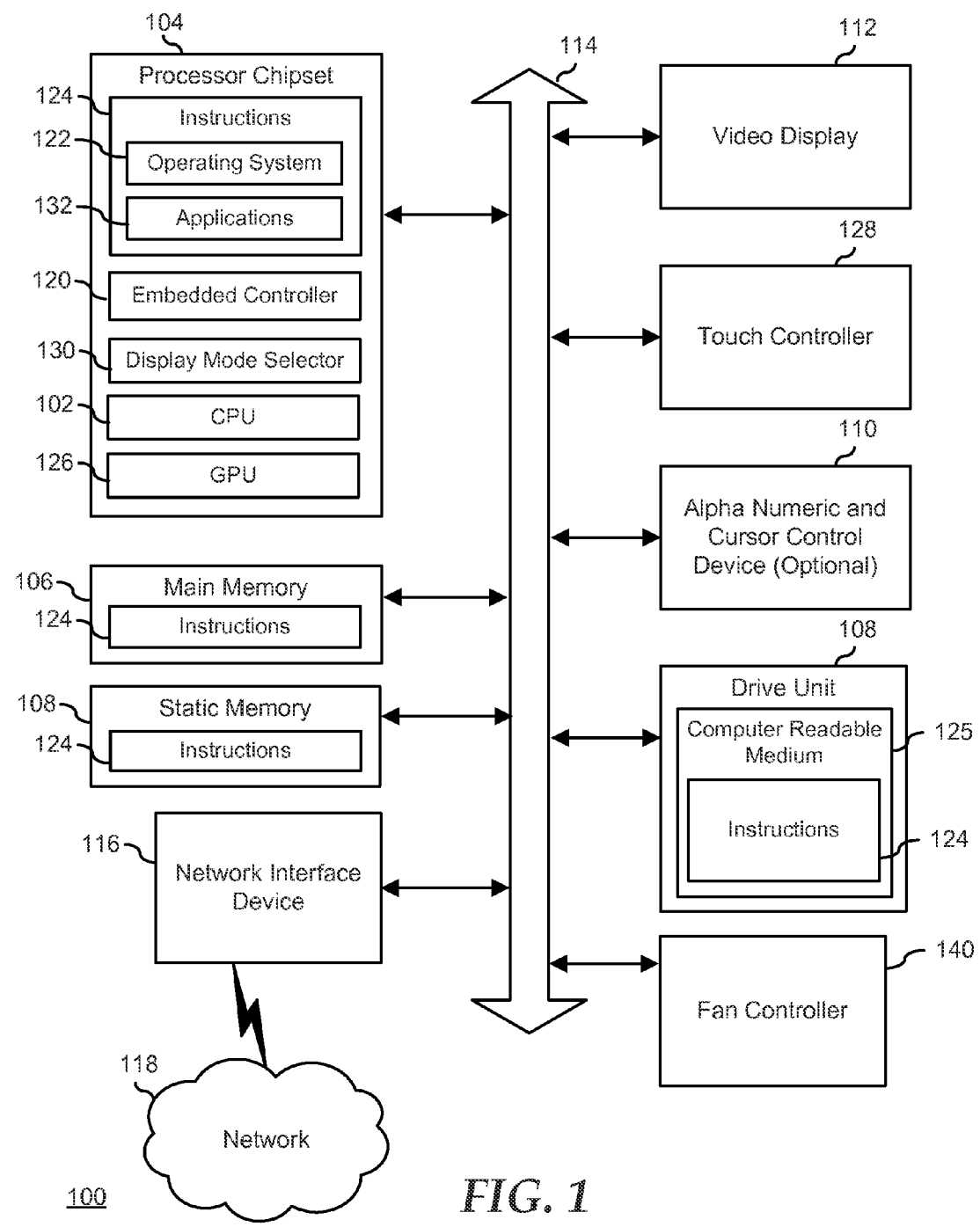
FIG. 1 is a block diagram of an information handling system.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings may be utilized in this application, as well as in other applications and with several different types of architectures such as distributed computing architectures, client or server architectures, or middleware server architectures and associated components.

For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer, such as desktop or laptop, tablet computer, mobile device (e.g., personal digital assistant (PDA) or smart phone), server (such as blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

In an embodiment, a fan controller can be utilized to control cooling fans within an information handling system. When the information handling is powered on, a fan can be operated at a current duty cycle, and a pressure transducer can determine a pressure reading for the current duty cycle. The determined pressure reading can be sent to a fan controller, which in turn can compare the pressure reading with a stored pressure-airflow curve to determine an airflow value that corresponds to the determined pressure reading. The fan controller can record this airflow value as the airflow value for the current duty cycle.

The fan controller can then repeat the determination of an airflow value for other duty cycles of the fan. The fan controller can then update a table for airflow versus percentage of duty cycle, and an exhaust temperature control equation can be updated based on the updated table. The fan controller can then resume automatic fan control using the updated exhaust temperature control equation.

FIG. 1 shows an information handling system 100 including conventional information handling systems components of a type typically found in client/server computing environments. The information handling system 100 may include memory, one or more processing resources such as a central processing unit (CPU) 102 and related chipset(s) 104 or hardware or software control logic. Additional components of system 100 may include main memory 106, one or more storage devices such as static memory or disk drives an optional external input device 110 such as a keyboard, and a cursor control device such as a mouse, or a video display 112. The information handling system 100 may also include one or more buses 114 operable to transmit communications between the various hardware components.

More specifically, system 100 represents a mobile user/client device, such as a dual screen mobile tablet computer. System 100 has a network interface device 116, such as for a wireless cellular or mobile networks (CDMA, TDMA, or the like), WIFI, WLAN, LAN, or similar network connection, enabling a user to communicate via a wired or wireless communications network 118, such as the Internet. System 100 may be configured with conventional web browser software. The web browser, may include for example Microsoft Corporation's Internet Explorer web browser software, Firefox or similar such browsers to allow the user to interact with websites via the wireless communications network 118.

System 100 may include a several sets of instructions 124 to be run by CPU 102 and any embedded controllers 120 on system 100. The instructions 124 can be stored in a computer readable medium 125 of a drive unit 108. One such set of instructions includes an operating system 122 with operating system interface. Additional sets of instructions in the form of multiple software applications 124 may be run by system 100. These software applications 124 may enable multiple uses of the dual display information handling system as set forth in more detail below.

System 100 includes a display screen 112. The display screen 112 has a display driver operated by one or more graphics processing units (GPUs) 126 such as those that are part of the chipset 104. The display screen 112 also has an associated touch controller 128 to accept touch input on the touch interface of the display screen.

The display screen 112 may also be controlled by the embedded controller 120 of chipset 108. Each CPU 126 and display driver is responsible for rendering graphics such as software application windows and virtual tools such as virtual keyboards on the display 112. Control of the location and positioning of these windows may be set by user input to locate the screens or by control setting default. In several embodiments described herein, control of the location for rendering for software application windows and virtual tools in the display may be determined by an application window locator system as described further in the embodiments herein. The application window locator system determines operating state rank of running software applications and determines whether and where to display application display windows and virtual tools based on relative orientation and state of usage information. Windows may include other forms of display interface with software application besides a window. It is contemplated that tiles, thumbnails, and other visual application access and viewing methods via a display are contemplated to be considered windows. Virtual tools may include virtual keyboard, virtual touchpad or controller, virtual buttons and other input devices rendered via a display screen and accepting feedback via a touch control system.

In another example of display control via the disclosures herein, the power to the display screen 112 is controlled by an embedded controller 120 in the processor chipset(s) which manages a battery management unit (BMU) as part of a power management unit (PMU) in the BIOS/firmware of the main CPU processor chipset(s). These controls form a part of the power operating system. The PMU (and BMU) control power provision to the display screen and other components of the dual display information handling system.

A display mode selector 130, in connection with an application window locator system as described in more detail below, determines priority of concurrently running software applications and how to automatically locate software application display windows and virtual tools on the screen via the chipset 104 based upon orientation of the display screen 112 as well as the software applications 132 currently running and active and their status. Determining which applications 132 are running determines a working software application context. Alternatively, the application window locator may operate on an embedded controller 120 separate from the main CPU chipset(s) 104. Additionally, the power management application may receive state of usage activity input from device state sensors.

Figure 2:
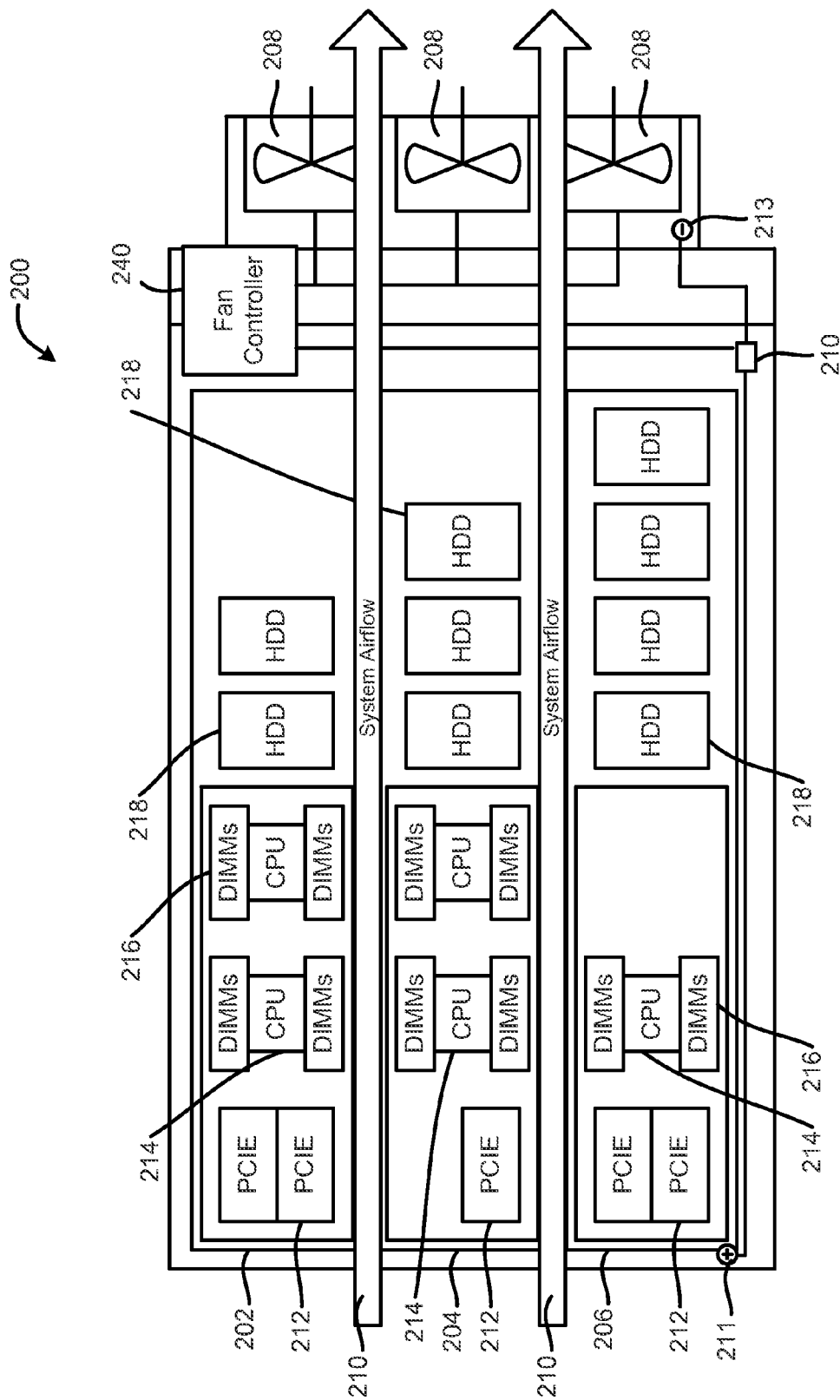
FIG. 2 is a block diagram of the information handling system including servers having different configurations of components.

In an embodiment, the information handling system 100 includes a fan controller 140 to control the operation of one or more fans within the information handling system, such as fans 208 in FIG. 2. The fan controller 140 utilizes a fan control algorithm to set a duty cycle for the fans within the information handling system 100. The duty cycle can be set based on a desired airflow to be pulled through the information handling system 100 to cool the components. The fan controller 140 can have a pressure-airflow curve stored within a memory that can be utilized to set the duty cycle of the fans to create the desired air flow. In an embodiment, the pressure-airflow curve is determined at various duty cycles, such that different duty cycles. For example, the pressure-airflow curve for the fans operating at a 20% duty cycle will be different than the pressure-airflow curve for the fans operating at an 80% duty cycle. In an embodiment, the pressure-airflow curves can be stored as a look-up table of discrete values, as coefficients for a polynomial curve, or the like.

In an embodiment, the configuration, such as number of components, of the information handling system 100 can affect whether the airflow within the information handling system is actually the anticipated airflow for the duty cycle of the fan. The information handling system 100 can include multiple servers and each server can have different components that in turn can affect the airflow as shown in FIG. 2.

FIG. 2 shows an information handling system 200 including servers 202, 204, and 206, one or more cooling fans 208, a pressure transducer 208, and a fan controller 240. Each of the servers 202, 204, and 206 include one or more peripheral component interconnect express (PCIE) devices 212, one or more central processing units (CPUs) 214, one or more dual inline memory modules (DIMMs) 216, and one or more hard disk drives (HDDs) 218. Different configurations of the servers 202, 204, and 206 placed within the information handling system 200 can affect the airflow in the entire information handling system. The fewer the components within a server, such as server 204, the greater the airflow at the same duty cycle of the fans 208, as compared to a server having more components, such as server 206. For example, the airflow 210 between servers 202 and 204 can be greater than the airflow between servers 204 and 206. Thus, the pressure-airflow curve data may or may not be accurate for the information handling system 200 depending on the configurations of the servers 202, 204, and 206. In an embodiment, the fan controller 240 can utilize the differential pressure transducer (DPT) 210 to determine the pressure within the information handling system 100 at different duty cycles of the fans 208.

During operation, the fan controller 240 can enter a learning mode to determine a relationship between the duty cycle of the fans 208 and airflow in the information handling system 200. The fan controller 240 can set the duty cycle for the fans 208 to a first such as 10%, 20%, 35%, or the like. While the fans 208 are operating at the first duty cycle level, the DPT 210 can determine a pressure reading within the information handling system. In an embodiment, the pressure reading is a differential pressure reading, such that the pressure within the information handling system 100 is determined based on a difference between the pressure at the front of the information handling system and the pressure at the back of the information handling system. The DPT 210 can be connected to two sensors 211 and 213 to receive the different pressure readings.

The DPT 210 can then provide the differential pressure reading to the fan controller 240, which in turn compares the received pressure reading to a stored pressure-airflow curve for the fans 208 while operating at the first duty cycle level. In an embodiment, the stored pressure-airflow curve can be initially generated for the fans and stored in the fan controller 240 when the information handling system was manufactured, can be a previously updated and stored pressure-airflow curve, or the like. The fan controller 240 can then store the airflow value determined from the stored pressure-airflow curve and can store this airflow value as a new airflow at the first duty cycle level.

After the airflow value is saved, the fan controller 240 can increase the duty cycle of the fans 208 by a pre-determined amount. In an embodiment, the pre-determined amount can be any amount of duty cycle increase, such as 5%, 10%, 12%, 20%, 30%, 35%, or the like. However, in other embodiments, different percentage increases to the duty cycle can be utilized without changing the scope of the disclosure. In another embodiment, the duty cycle for the fans 208 can start at 100% and can be decreased with each iteration without changing the scope of the disclosure.

After the fan controller 240 changes the duty cycle for the fans 208, the DPT 210 can then determine a new pressure reading, which can be provided to the fan controller. The fan controller 240 can determine and store a new airflow value for the duty cycle based on the pressure reading. The fan controller 240 can continue to increase the duty cycle of the fans 208 until the duty cycle is 100%. After the new airflow for each of the duty cycles up to 100% is determined, the fan controller 240 can update a table for airflow versus duty cycle of the fans 208. In an embodiment, the updated airflow-duty cycle table can correlate an airflow value to a particular duty cycle of the fans 208 for the current configuration of the information handling system, such as the configurations of servers 202, 204, and 206. The fan controller 240 can use the updated airflow-duty cycle table to update an exhaust temperature control equation that is to be utilized in the fan control algorithm.

The fan controller 240 can store the fan control algorithm, and exhaust temperature control equation, and then the exit the learning mode. The fan controller 240 can then resume automatic fan control, which can utilize these values and equations. In an embodiment, the control equation is utilized by the fan controller 240 during in the fan control algorithm to optimize airflow, fan power consumption, acoustic output of the fan, and the like.

Figure 3:
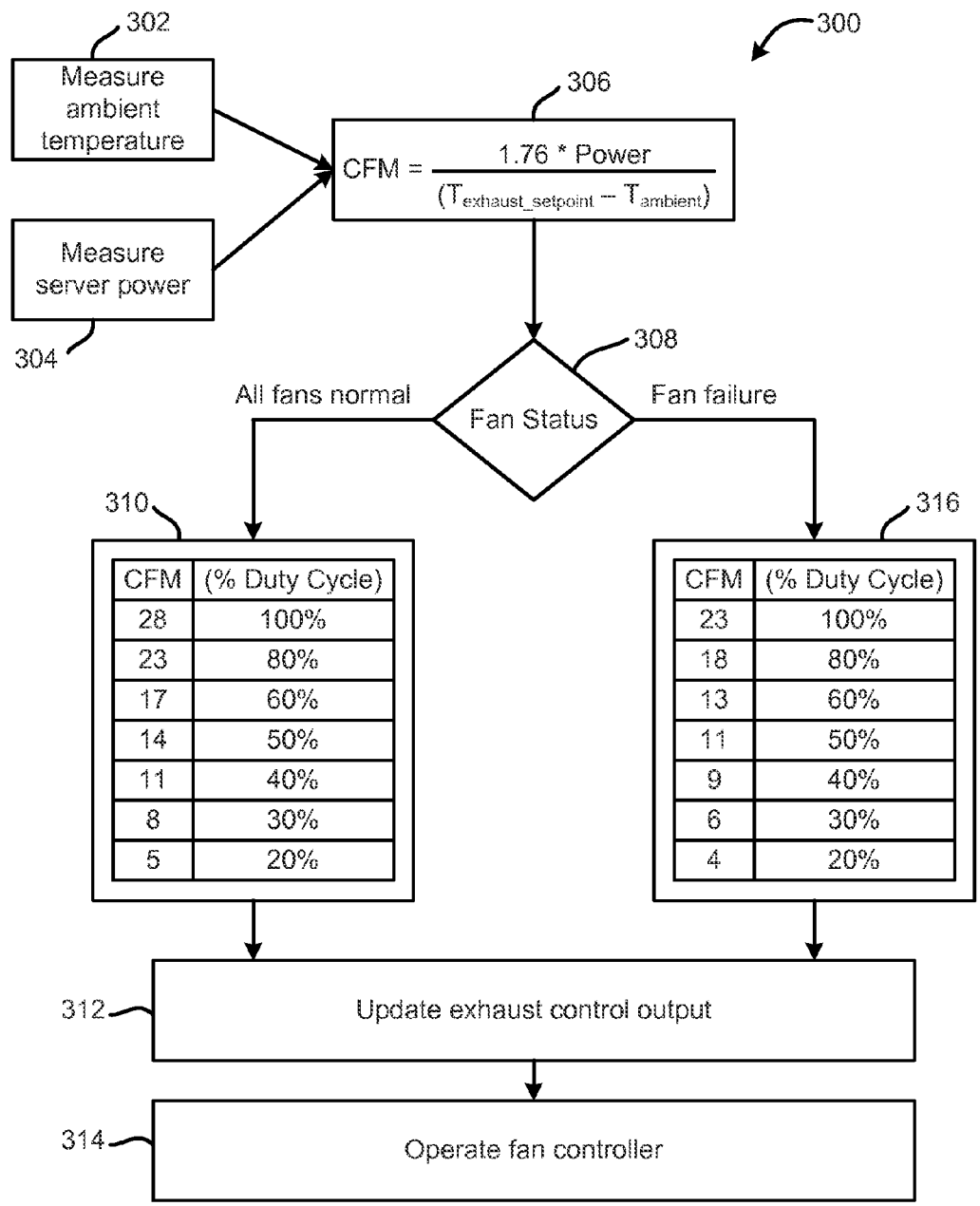
FIG. 3 is a flow diagram of executing a fan control algorithm in a fan controller of the information handling system.

FIG. 3 is a flow diagram of a fan control algorithm 300 in a fan controller of the information handling system 100. At block 302, the ambient temperature of the information handling system is measured. At block 304, the power of the server is measured. A airflow value is calculated based on the measured power and the measure ambient temperature at block 306. In an embodiment, the airflow is calculated using the equation 1 below:

$$\text{Airflow}(CFM) = \frac{1.76 * \text{Power}}{T_{exhaust\_setpoint} - T_{ambient}} \quad \text{(EQ. 1)}$$

In an embodiment, the $T_{exhaust\_setpoint}$ can be the desired temperature at the air outlet in the information handling system. At block 308, a determination is made whether a fan has failed or is normal. If all of the fans are operating normally, the airflow-duty cycle table in block 310 is utilized, and the flow continues at block 312. Otherwise, if a fan failure has been detected, the airflow-duty cycle table in block 316 is utilized, and the flow continues at block 312. At block 312, the exhaust control output is updated based on whether the airflow-duty cycle at block 310 or 316 is utilized. At block 314, the fan controller is operated using the update exhaust control output.

Figure 4:
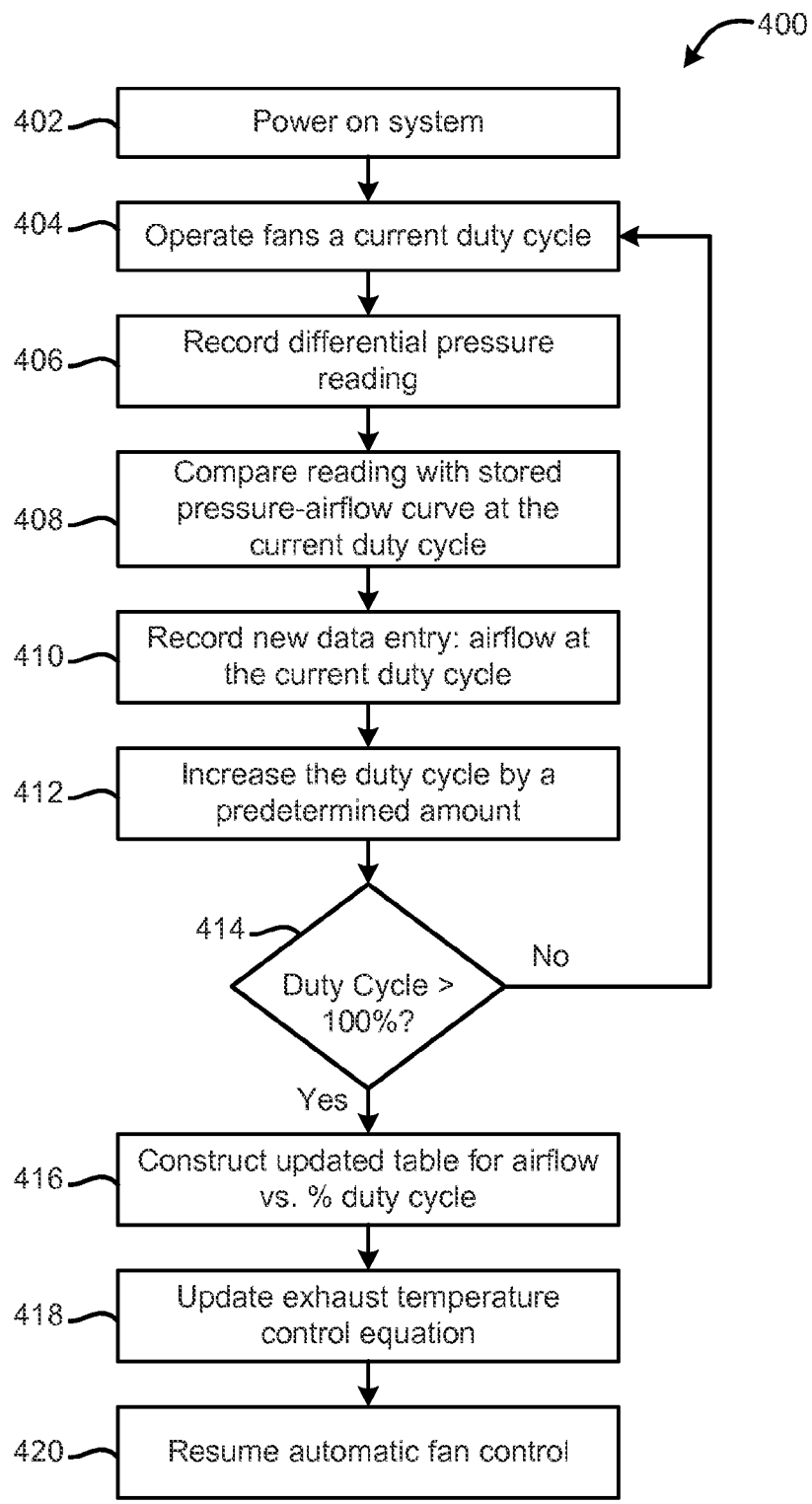
FIG. 4 is a flow diagram of a method for modifying a fan control algorithm according to at least one embodiment of the present disclosure.

FIG. 4 illustrates a method 400 for modifying a fan control algorithm according to at least one embodiment of the present disclosure. At block 402, the information handling system is powered on. In an embodiment, the information handling system can include different components according to one or more configurations. For example, in one configuration, the information handling system can include one PCIE card, two CPUs, four DIMMs, and two HDDs. A fan is operated at a current duty cycle at block 404. In an embodiment, the duty cycle can be 20%, 40%, 60%, 80%, and 100%. At block 406, a pressure reading is determined. In an embodiment, the pressure reading is determined by a differential pressure transducer.

At block 408, the pressure reading is compared with a stored pressure-airflow curve at the current duty cycle. In an embodiment, the stored pressure-airflow curve can be initially generated for the fan and stored in the fan controller when the information handling system was manufactured, can be a previously updated and stored pressure-airflow curve, or the like. The pressure-airflow curve can plot corresponding pressure values and airflow values of the fan for a particular duty cycle. A new airflow data entry is recorded in the pressure-airflow curve for the duty cycle at block 410. In an embodiment, the new airflow data entry can include assigning the determined airflow value to the current duty cycle. For example, the airflow value for the determined pressure reading in the pressure-airflow curve is assigned to the current duty cycle of the fan.

At block 412, the duty cycle is increased by a pre-determined amount. In an embodiment, the pre-determined amount can be any amount of duty cycle increase, such as 5%, 10%, 15%, 20%, 25%, 35%, or the like. The flow continues at block 414, and a determination is made whether the duty cycle is greater than 100%. In an embodiment, the duty cycle for the fan can start at 100% and can be decreased during each iteration through the flow without varying the scope of the disclosure. If the duty cycle is not greater than 100%, the flow continues as stated above at block 404. If the duty cycle is greater than 100%, an updated table for airflow versus percentage of duty cycle is constructed at block 416. In an embodiment, the updated airflow-duty cycle table can correlate an airflow value to a particular duty cycle of the fan for the configuration of the information handling system. At block 418, an exhaust temperature control equation is updated. In an embodiment, the control equation is utilized by the fan controller during operation of the information handling system to optimize airflow, fan power consumption, acoustic output of the fan, and the like. At block 420, automatic fan control is resumed in the fan controller.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
   a pressure transducer to produce a pressure reading in response to airflow through the information handling system; and
   a fan controller configured to communicate with the pressure transducer, the fan controller to operate a fan of an information handling system at a first duty cycle, to receive a first pressure reading from the pressure transducer, to determine a first airflow amount for the first duty cycle based on the first pressure reading, to create a first updated airflow-duty cycle table based on the first airflow amount at the first duty cycle, and to update a temperature control algorithm based on the first updated airflow-duty cycle table, and to control the fan based on the updated temperature control algorithm to cool the information handling system.

2. The information handling system of claim 1, wherein the first pressure reading is based on the fan being operated at the first duty cycle.

3. The information handling system of claim 1, the fan controller further configured to compare the first pressure reading with a stored pressure-airflow curve, and to determine the first airflow amount that corresponds to the first pressure reading in the stored pressure-airflow curve.

4. The information handling system of claim 1, wherein the first pressure reading received while the fan is operated at the first duty cycle varies based on a configuration of the information handling system.

5. The information handling system of claim 4, wherein the configuration includes a hard disk drive, a dual inline memory module, and a central processor unit.

6. The information handling system of claim 1 wherein the pressure transducer is a differential pressure transducer.

7. A method comprising:
   operating a fan of an information handling system at a first duty cycle;
   receiving, from a pressure transducer, a first pressure reading, wherein the first pressure reading is based on the fan being operated at the first duty cycle;
   determining, by a fan controller, a first airflow amount for the first duty cycle based on the first pressure reading;
   creating a first updated airflow-duty cycle table based on the first airflow amount at the first duty cycle;
   updating a temperature control algorithm based on the first updated airflow-duty cycle table; and
   controlling, by the fan controller, the fan based on the updated temperature control algorithm to cool the information handling system.

8. The method of claim 7 further comprising:
   increasing the first duty cycle by a predetermined amount to create a second duty cycle;
   operating the fan at the second duty cycle;
   receiving, from the pressure transducer, a second pressure reading, wherein the second pressure reading is based on the fan being operated at the second duty cycle;
   determining, by the fan controller, a second airflow amount for the second duty cycle based on the second pressure reading;
   creating a second updated airflow-duty cycle table based on the second airflow amount at the second duty cycle; and
   updating the temperature control algorithm based on the second updated airflow-duty cycle table.

9. The method of claim 7, further comprising:
   comparing the first pressure reading with a stored pressure-airflow curve; and
   determining the first airflow amount that corresponds to the first pressure reading in the stored pressure-airflow curve.

10. The method of claim 7, wherein the first pressure reading received while the fan is operated at the first duty cycle varies based on a configuration of the information handling system.

11. The method of claim 10, wherein the configuration includes a hard disk drive, a dual inline memory module, and a central processor unit.

12. The method of claim 7, wherein the pressure transducer is a differential pressure transducer.

13. A non-transitory computer readable medium when executed by a processor to cause the processor to implement a method, the method comprising:
   operating a fan of an information handling system at a first duty cycle;
   receiving, from a pressure transducer, a first pressure reading, wherein the first pressure reading is based on the fan being operated at the first duty cycle;
   determining, by a fan controller, a first airflow amount for the first duty cycle based on the first pressure reading;
   creating a first updated airflow-duty cycle table based on the first airflow amount at the first duty cycle;
   updating a temperature control algorithm based on the first updated airflow-duty cycle table; and
   controlling the fan based on the updated temperature control algorithm to cool the information handling system.

14. The non-transitory computer readable medium of claim 13 further comprising:
   increasing the first duty cycle by a predetermined amount to create a second duty cycle;
   operating the fan at the second duty cycle;
   receiving, from the pressure transducer, a second pressure reading, wherein the second pressure reading is based on the fan being operated at the second duty cycle;
   determining, by the fan controller, a second airflow amount for the second duty cycle based on the second pressure reading;
   creating a second updated airflow-duty cycle table based on the second airflow amount at the second duty cycle; and
   updating the temperature control algorithm based on the second updated airflow-duty cycle table.

15. The non-transitory computer readable medium of claim 13, further comprising:
comparing the first pressure reading with a stored pressure-airflow curve; and
determining the first airflow amount that corresponds to the first pressure reading in the stored pressure-airflow curve.

16. The non-transitory computer readable medium of claim 13, wherein the first pressure reading received while the fan is operated at the first duty cycle varies based on a configuration of the information handling system.

17. The non-transitory computer readable medium of claim 16, wherein the configuration includes a hard disk drive, a dual inline memory module, and a central processor unit.

* * * * *